United States Patent [19]
Hayashi et al.

[11] Patent Number: 5,694,328
[45] Date of Patent: Dec. 2, 1997

[54] METHOD FOR DESIGNING A LARGE SCALE INTEGRATED (LSI) LAYOUT

[75] Inventors: Emi Hayashi, Kyoto; Hiroyuki Miyamoto, Ohtsu; Yoshihiro Tabira, Osaka, all of Japan

[73] Assignee: Matsushita Electronics Corporation, Osaka, Japan

[21] Appl. No.: 631,904

[22] Filed: Apr. 12, 1996

Related U.S. Application Data

[63] Continuation of Ser. No. 102,616, Aug. 5, 1993, abandoned.

[30] Foreign Application Priority Data

Aug. 6, 1992 [JP] Japan ................... 4-210028

[51] Int. Cl.$^6$ .................................................. G06F 17/50
[52] U.S. Cl. ........................... 364/491; 364/490; 364/489; 364/488
[58] Field of Search ....................... 364/488, 409, 364/490, 491

[56] References Cited

U.S. PATENT DOCUMENTS

| | | | |
|---|---|---|---|
| 3,654,615 | 4/1972 | Freitag | 364/490 |
| 4,630,219 | 12/1986 | DiGiacomo et al. | 364/488 |
| 4,683,384 | 7/1987 | Shibata et al. | 364/491 |
| 4,839,820 | 6/1989 | Kinoshita et al. | 364/491 |
| 4,908,772 | 3/1990 | Chi | 364/491 |
| 4,910,680 | 3/1990 | Hiwatashi | 364/491 |
| 5,202,840 | 4/1993 | Wong | 364/490 |
| 5,231,589 | 7/1993 | Itoh et al. | 364/490 |
| 5,237,514 | 8/1993 | Curtin | 364/490 |
| 5,359,538 | 10/1994 | Hui et al. | 364/491 |

*Primary Examiner*—Vincent N. Trans
*Attorney, Agent, or Firm*—Ratner & Prestia

[57] ABSTRACT

A plurality of cells which have input terminals and output terminals on four sides are divided into a plurality of groups of cells. The plurality of cells are placed in an array form at positions which are either adjacent or nonadjacent. A plurality of groups of cells are placed one after another such that the resulting layout becomes substantially rectangular or square. Power buses are routed parallel to each other, and power supply lines are routed from the power buses to cells. Data lines are routed between the terminals of the cells.

2 Claims, 9 Drawing Sheets

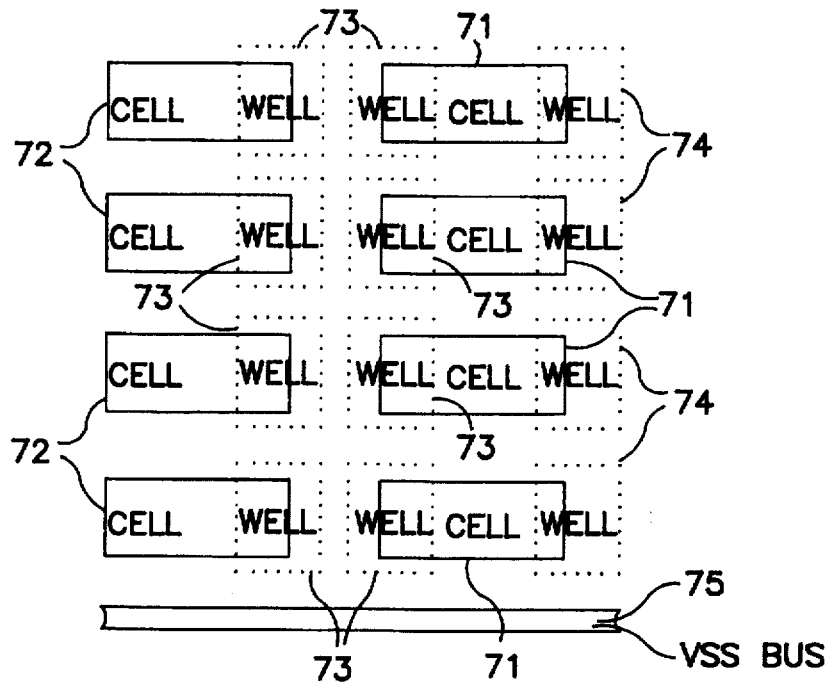
FIG. 5
FIG. 6
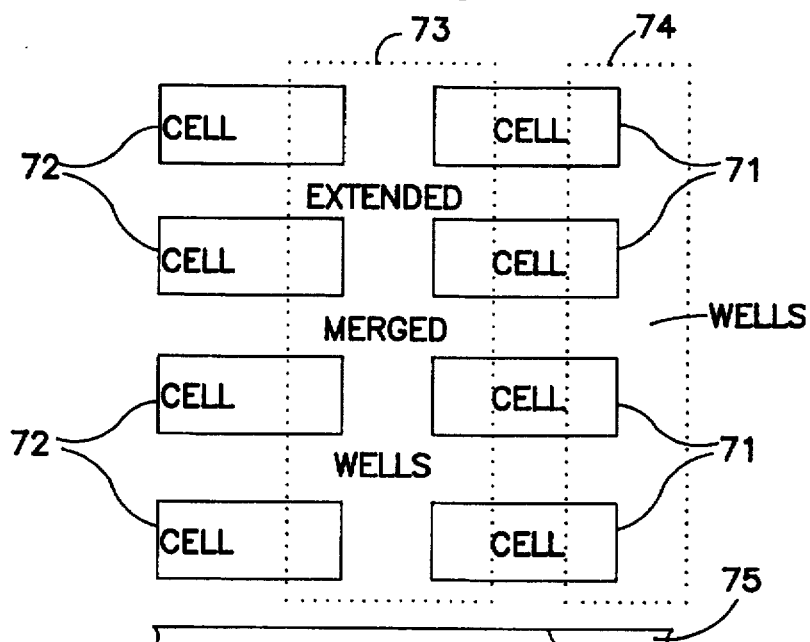
FIG. 7

METHOD FOR DESIGNING A LARGE SCALE INTEGRATED (LSI) LAYOUT

This application is a continuation of application Ser. No. 08/102,616 filed Aug. 5, 1993 now abandoned.

BACKGROUND OF THE INVENTION

1. Field of the Invention

The present invention relates to a method for automatically designing a LSI layout used in semiconductor integrated circuits that a large number of cells are integrated in a semiconductor chip and interconnected; especially in semiconductor integrated circuits which contain digital signal processing application blocks.

2. Prior Art

Presently, owing to the requirements for rapidly increasing densities and timing speed in integrated circuits for the quality of designing layout is becoming critical in determining the property of the integrated circuits. In particular, recently there has been an increase in the demand for digital audio-visual products and digital TV etc. Thus the method of design for digital signal processing application blocks, which constitute the main parts of the integrated circuits that are used in above mentioned products, has become very important.

Generally, when a computer automatically designs the layout of integrated circuits, a "building block" methodology is used. In the "building block methodology", inside a single chip or a single block, different types of cells having different logic functions are adjoined together horizontally or vertically to form a sub-block. These sub-blocks are then placed in different rows vertically or horizontally with some space between each of them, and the input and output terminals of these sub-blocks are then joined together by data lines based on the connectivity information.

The former method for automatically designing a LSI layout by the "building block" methodology is explained with a digital signal processing schematic. A digital signal processing application block has a special schematic, therefore special considerations are required.

FIG. 10 shows a block of an electronic circuit. The group 1 consists of sub-groups A, B, C and D, where n1, n2, n3 and n4 show the number of cells in groups A, B, C and D, respectively. Group 2 consists of unit cells g and h. The unit cell g and group 2 have input terminals 3,4, and the unit cell h and group 2 have output terminals 5,6. Output terminals 5,6 are also input terminals of group 1.

FIG. 11 shows the expanded figure of the circuit in FIG. 10. The value of n1, n2, n3 and n4 is 4, and groups A, B, C and D have cells a1 to a4, b1 to b5, c1 to c4, d1 to d4, respectively. Cells a1, a2, a3 and a4 have input terminals 11, 12, 13 and 14, respectively, and cells d1, d2, d3 and d4 have output terminals 15, 16, 17 and 18, respectively.

FIG. 12 shows a semiconductor integrated circuit laid out by the former method for automatically designing LSI layout; a plane figure of the placement of cells in group A in FIG. 11 by the prior art. In this type of a layout, the cells are abutted together to form rows of cells. The space between these rows is a wiring area. The power and ground wirings in the rows of cells are joined automatically when these cells are abutted together. The power and ground supply lines at the end of the cell rows are connected to the power bus 19 and ground bus 20 which run perpendicular to the rows on either side. The input and output terminals are on the top and bottom sides of the cells, and the data lines between the input and output terminals of cells are connected in the wiring area on the top and bottom of the cell rows. In FIG. 12, the input terminals 11 to 14 of cells a1 to a4 are connected by data lines 21 to 24, respectively. The clock line 25 is connected to flip-flop circuits inside cells a1 to a4.

In the digital signal processing application block such as FIG. 11, the wiring delay of the signals between the groups A to D, and the wiring delay of the signals from the input terminals 11 to 14, to the output terminals 15 to 18 through the groups A to D, need to be as similar to each other as possible. Also, the length of data lines within a group needs their data lines to be as short as possible.

But in a conventional constitution, only connections between cells are considered, therefore, and placement and routing are completed without considering the above grouping. As a result, as can be seen from cells a1 to a4 in FIG. 12, each cell of each group is placed randomly, thus causing the data line length within each group to become longer. Furthermore, the clock line 25 has a possibility of clock skew occurring. The data line delay fluctuations from the input terminals 11 to 14, to output terminals 15 to 18 through groups A to D, are also significant.

Since the cells need to have a fixed height or width, in many cases, the cells' size become larger compared to the schematic scale. Accordingly, this causes a problem because the block size become larger.

Additionally, since cells are abutted together to form rows of cells, well regions connected to ground potential need to be created on one side of each cell. Therefore, cell design becomes more constrained.

SUMMARY OF THE INVENTIONS

The method of the present invention for automatically designing LSI layout has four steps. In the first step, the cells in a block, which have input terminals and output terminals on four sides, are placed at separate or adjoining position in an array form. In the second step, the buses of electric source that supply said cells placed in the first step with an electric source potential are routed parallel to each other. In the third step, the power supply lines between said buses of electric source and said cells are routed. In the fourth step, the data lines between all the cells in said groups are routed with said input terminals and said output terminals on said four sides.

Before the above mentioned cell placement, the cells are divided into groups. First, the group which consists of cells that need data line delay to be held at a minimum are placed (with cells being separated or joined together) in an array form. Next, the other group of cells are placed in the empty spaces left above each row of cells already placed, such that the final block shape becomes rectangular or square.

Thus in the invention, since groups of cells which have input terminals and output terminals on four sides are placed at separate or adjoining positions, in an array form, the height of cells can be decided freely. Therefore, the cells' size is maintained at a minimum size when designing cells, and the total laid out block size also becomes smaller.

The width of the buses of electric source and the power supply lines which supply each cell with an electric source potential is decided freely, and the data lines between said cells are routed using the input terminals and output terminals on the four sides of the cells. This makes the data line capacity and resistance optimum, and makes the data line delay smaller.

Furthermore, since the cells are divided into groups, and the first group is placed, the remaining groups are placed in the empty space, thus the total laid out block size becomes smaller.

Less constrained cell design is possible because the well regions are extended and merged after placement and routing, and the merged well regions are connected to the power source potential.

BRIEF DESCRIPTION OF THE DRAWINGS

FIG. 5 is a figure showing a cell in an embodiment of the invention;

FIG. 6 is a plane figure showing one step in the second embodiment of the invention;

FIG. 7 is a plane figure showing one step in the second embodiment of the invention;

DETAILED DESCRIPTION OF THE INVENTION

Figure 1:
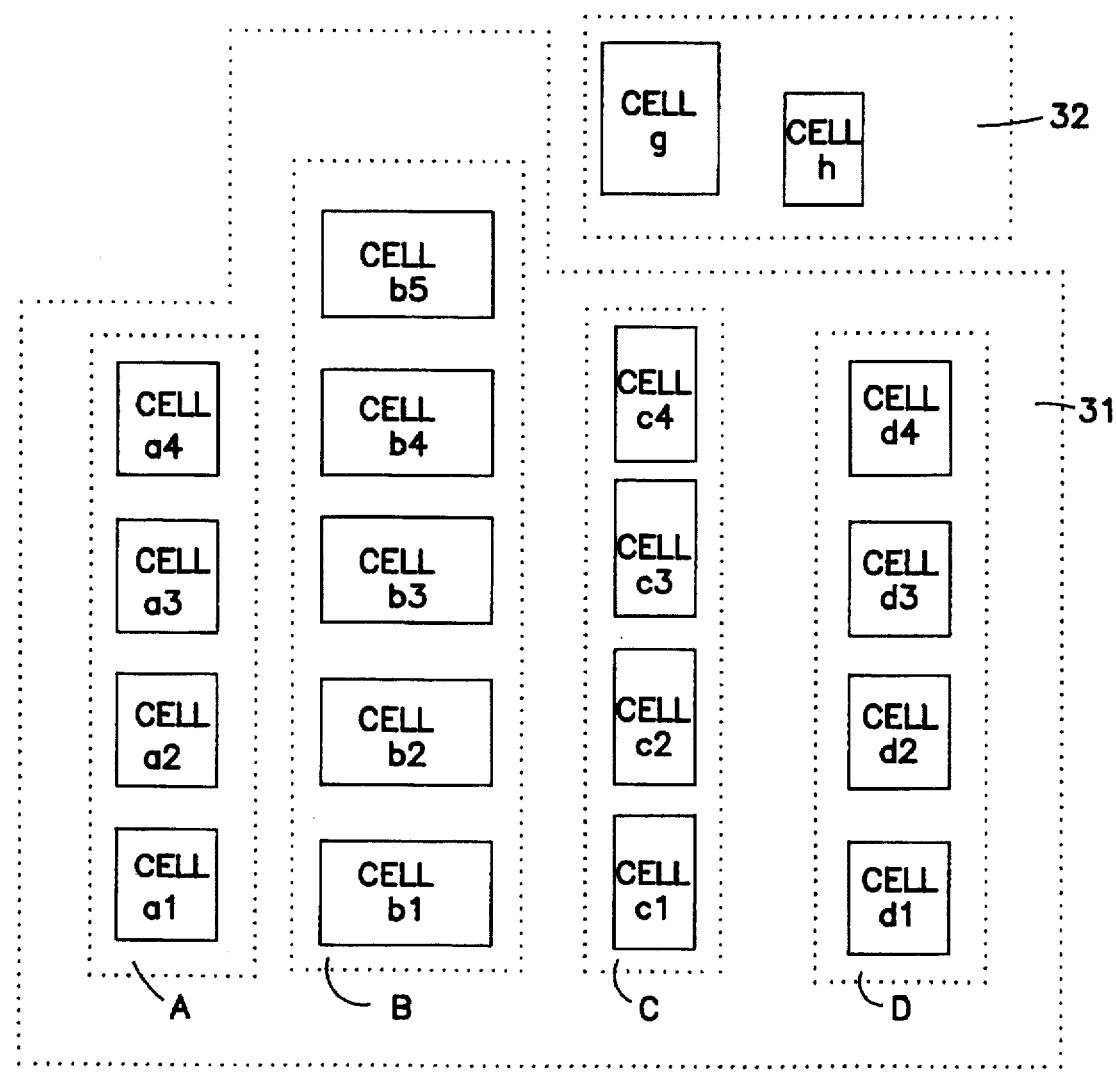
FIG. 1 is a layout figure showing one step in the first embodiment of the invention.

Referring now to the drawings, several embodiments of the invention are described in detail below.

Figure 11:
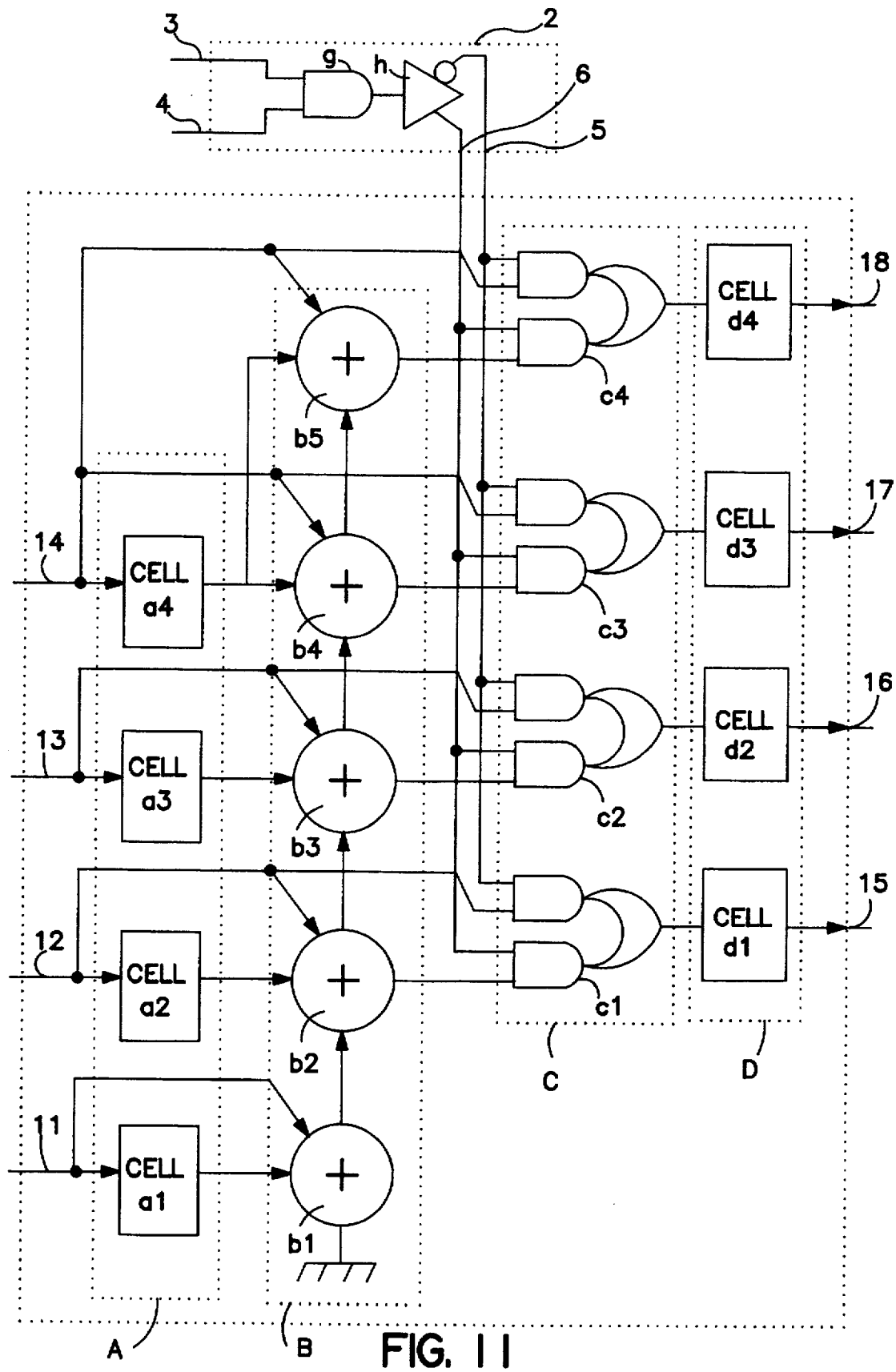
FIG. 11 is an expanded figure of the circuit in FIG. 10.
Figure 12:
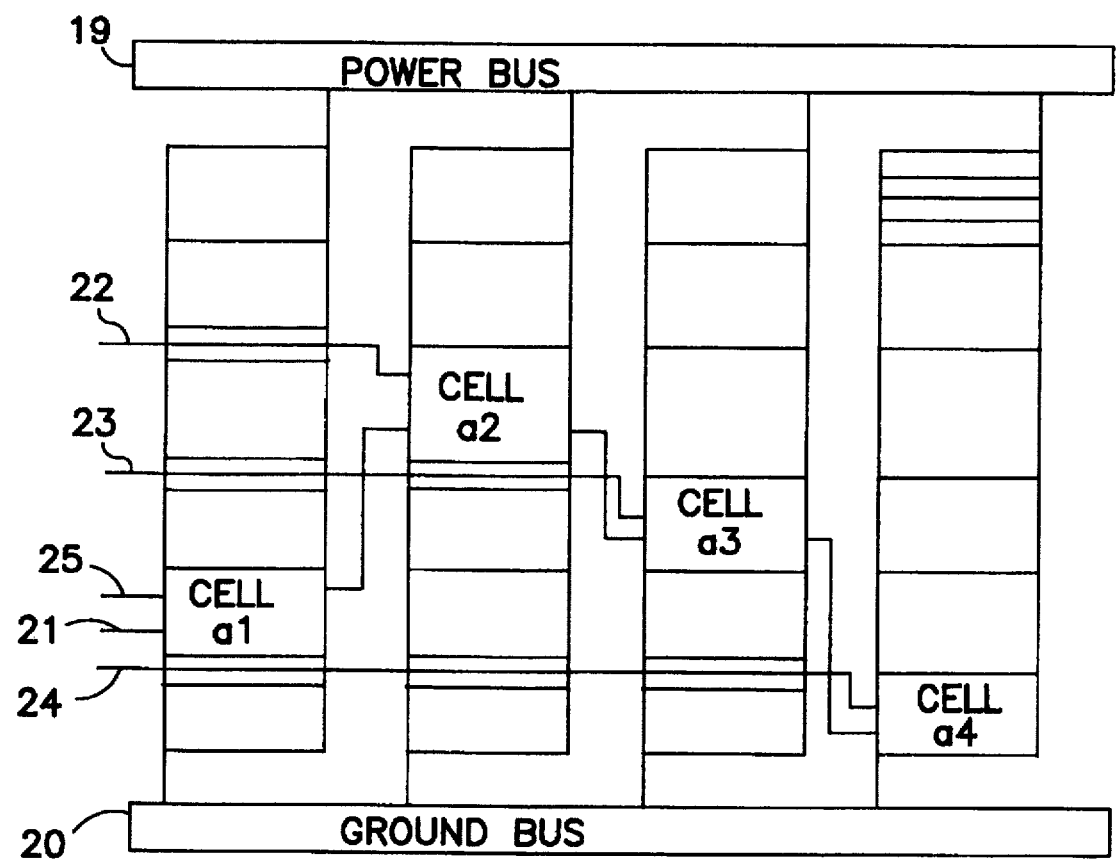
FIG. 12 is a layout figure in the prior art.

FIG. 1 shows a result of the placement of cells in the circuit in FIG. 11 by the method for automatically designing LSI layout of the invention.

In FIG. 1, the layout comprises a group 31 in which groups A to D having cells are placed and a group 32 in which cells g and h are placed. In group 31, cells a1 to a4, b1 to b5, c1 to c4, and d1 to d4 with the input terminals and output terminals on the four sides of the cell are placed in groups A to D, respectively. The cells a1 to a4 have the same function. When considering the signal flow it is determined that the cells a1 to a4 need to be placed close to each other in group A in an array form separated from each other. In the same way, in groups B to D, cells b1 to b5, c1 to c4, d1 to d4 are placed in an array form separated from each other.

In this automatic layout methodology, first, the cells in the circuit are divided into group 31 which consists of groups A to D, and group 32 which consists of cells g, h. After group 31 is placed, cells in group 32 are placed in the empty spaces left above cells already placed, such that the final block shape becomes almost rectangular or square.

Figure 2:
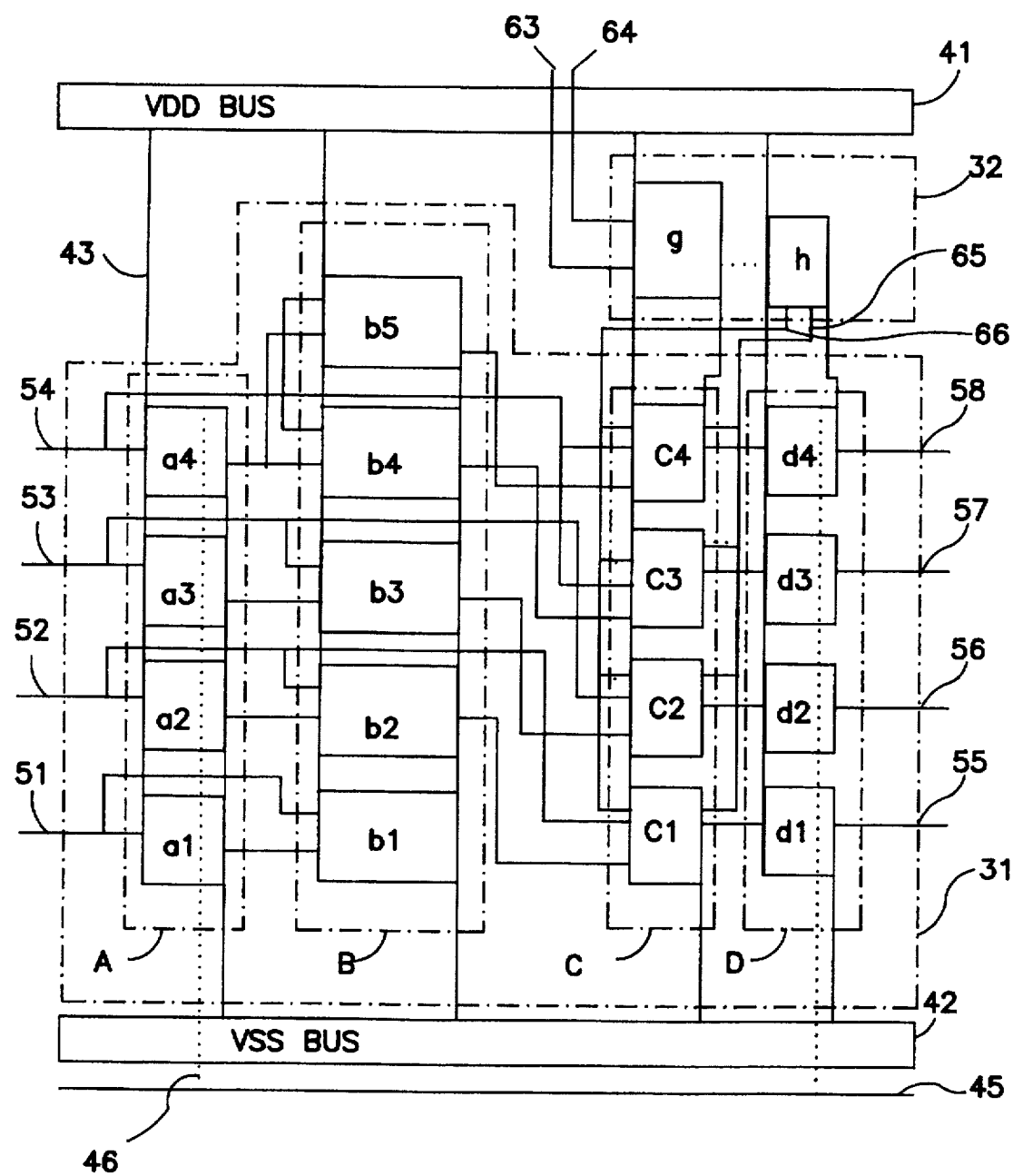
FIG. 2 is a layout figure showing one step in the first embodiment of the invention.

FIG. 2 shows a result of routing between power buses and cells placed in group 31, 32, and between the input and output terminals of the cells in FIG. 1 by the method for automatically designing LSI layout in the first embodiment of the invention.

First, the power bus (VDD bus) 41 and the power bus (VSS bus) 42 that supply the cells with an electric source potential are routed parallel to the both side of groups 31, 32.

Next, the power supply lines (VDD supply lines) 43 and the power supply lines (VSS supply lines) 44 are routed from the VDD bus 41 and the VSS bus 42 to cells a1 to a4, b1 to b5, c1 to c4, d1 to d4.

In same way, the clock bus 45 is routed parallel to the VDD bus 41 and the VSS bus 42, and the clock lines 46 is are routed between the clock bus 45 and the cells a1, a2, a3 and a4.

Next, the data lines are routed between the input terminals and output terminals on four sides of the cells a1 to a4, b1 to b5, c1 to c4, d1 to d4, g, and h. The data lines 51 to 54 are connected to the input terminals of the group 1; data lines 55 to 58 are connected to the output terminals of the group 1; data lines 63, 64 are connected to the input terminals of the group 2; data lines 65, 66 are connected to the input terminals of the group 1 and the output terminals of the group 2. The data lines 65, 66 are also connected to the output terminals in the side of cell h.

Figure 3:
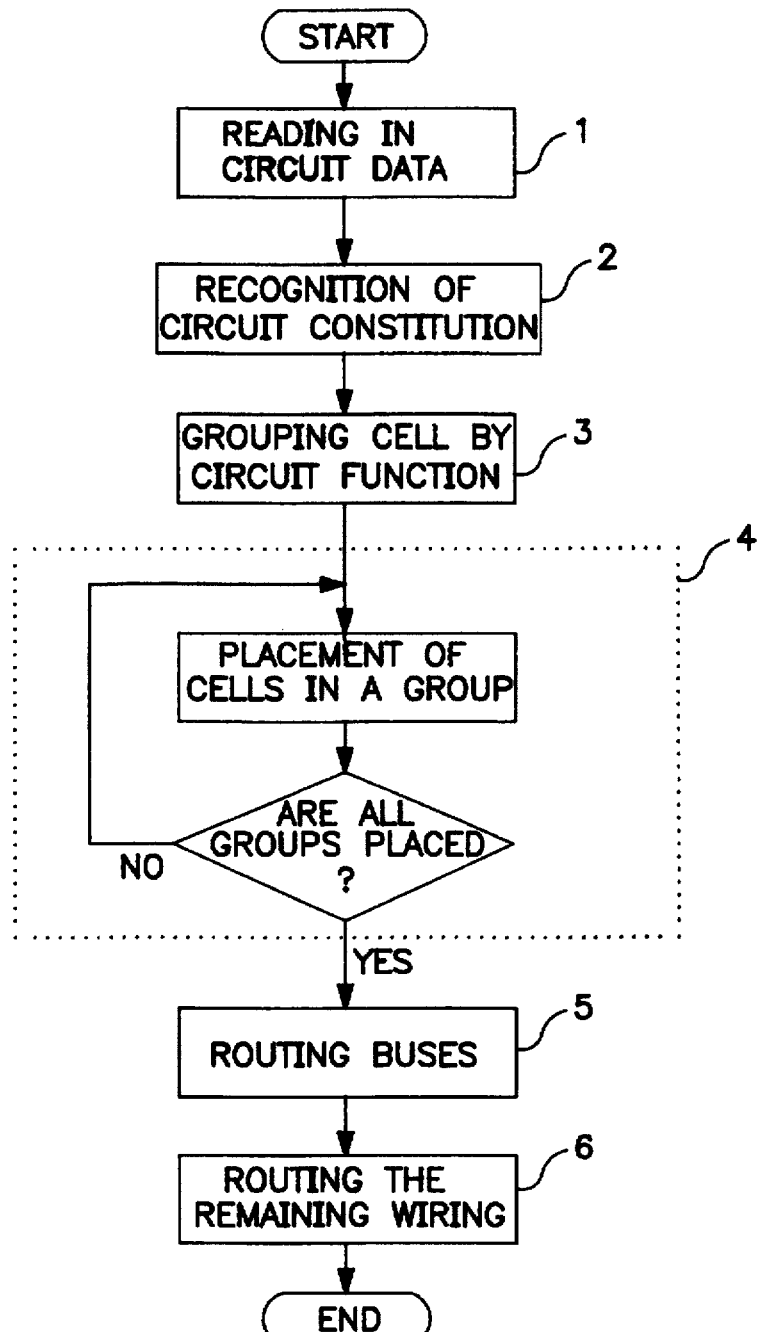
FIG. 3 is a flow chart showing a method for automatically designing LSI layout in the first embodiment of the invention.

FIG. 3 is a flow chart showing the method for automatically designing LSI layout of the invention.

In this flow, the information of the electronic circuit data is read (1); the circuit constitution and connectivity are recognized by the information of circuit read (2); cells are separated into groups and priorities are assigned to these groups based on the connectivity, logic function and timing constraints including data lines delay, and the connectivity information between the input terminals and output terminals of these block groups (3).

Next, cells in the group with the highest priority are placed in an array form at separate or adjoining position based on the signal flow. Then the cells with a lower priority in the group are placed in the empty space, such that the resulting layout becomes almost rectangular or square. This operation is continued until all groups are placed (4).

Next, the buses of power and ground are routed parallel to each other, and the clock, bus that supply cells with clock signal are routed parallel to said power buses (5).

Finally, the power supply lines that supply cells with power source potential are routed between the power buses and the cells. Next, the data lines are routed between the cells using the input and output terminals available on all sides of the cells (6). The width of the power buses clock buses and the supply lines between those buses and the cells, can be specified to be different from the width of the data lines connected between the cells, depending on the wiring capacity and resistance.

Since the cells can be placed next to each other, both the height and the width of cells do not need to be same as the other cells, therefore, cell sizes can be of minimum size. As a result, the total block size becomes smaller. Furthermore, little space is wasted since the block is divided into groups with the remaining cells placed in the empty space after the first group has been placed.

Because there is freedom in routing the power, ground and clock supply lines to cells and because placement is derived from the signal flow, the propagation delay including the data line delay can be reduced considerably.

Referring now to the drawings, the second embodiment of the invention is described in order of layout.

Figure 4:
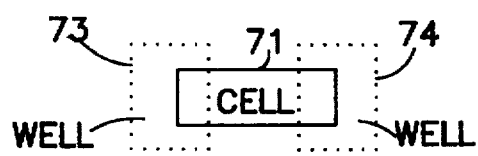
FIG. 4 is a figure showing a cell in an embodiment of the invention.

FIGS. 4 and 5 show an example of a cell. The cell contains outlines 71 and 72, and well regions 73 and 74, that decide an electric conductive type; well region 73 is connected to VSS bus, and well region 74 is connected to VDD bus.

FIG. 6 is a result of placement of the cells in FIGS. 4, 5, separated from each other, in an array form. The VSS bus 75 is routed perpendicular to the cell rows.

FIG. 7 shows a result where the well regions 73, 74 are extended and merged.

Figure 8:
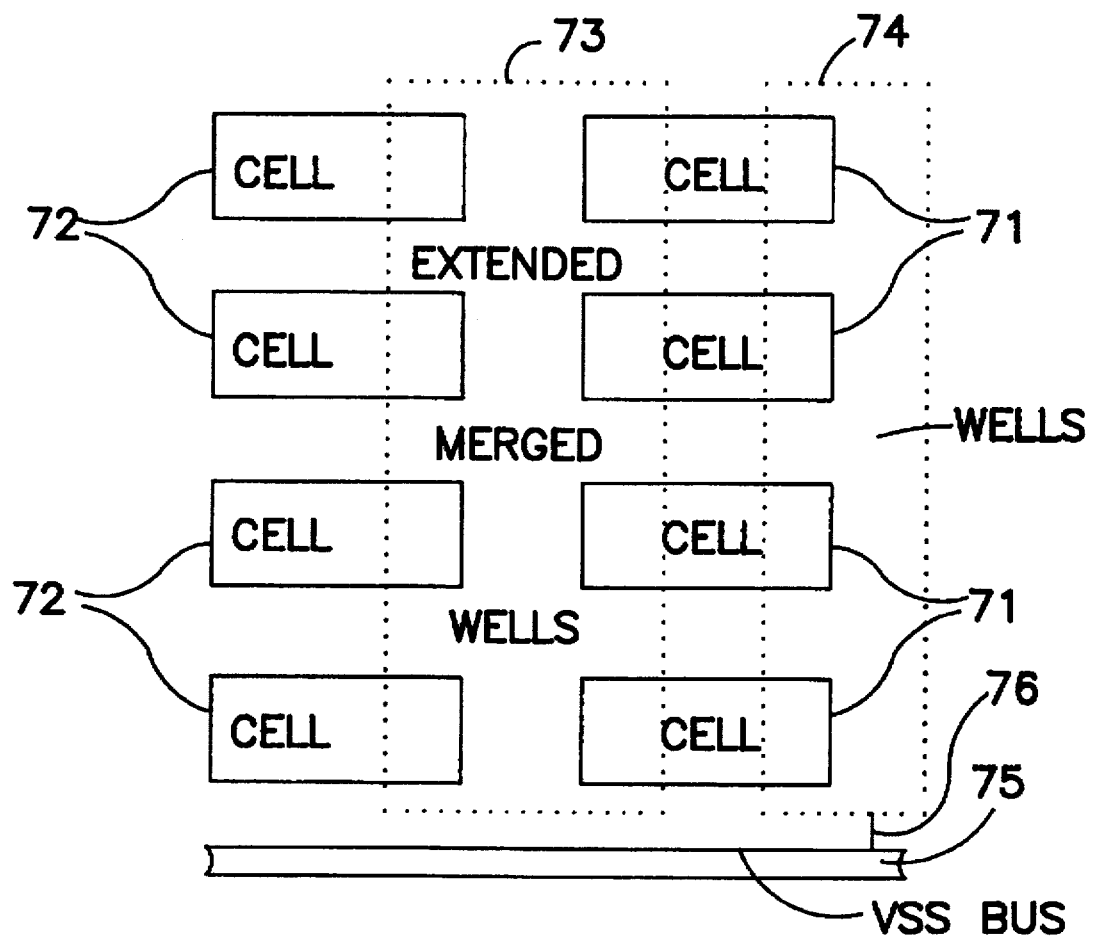
FIG. 8 is a plane figure showing one step in the second embodiment of the invention.

FIG. 8 shows a result where the well region 74 is connected to the VSS bus 75 through the VSS supply lines 76.

Figure 9:
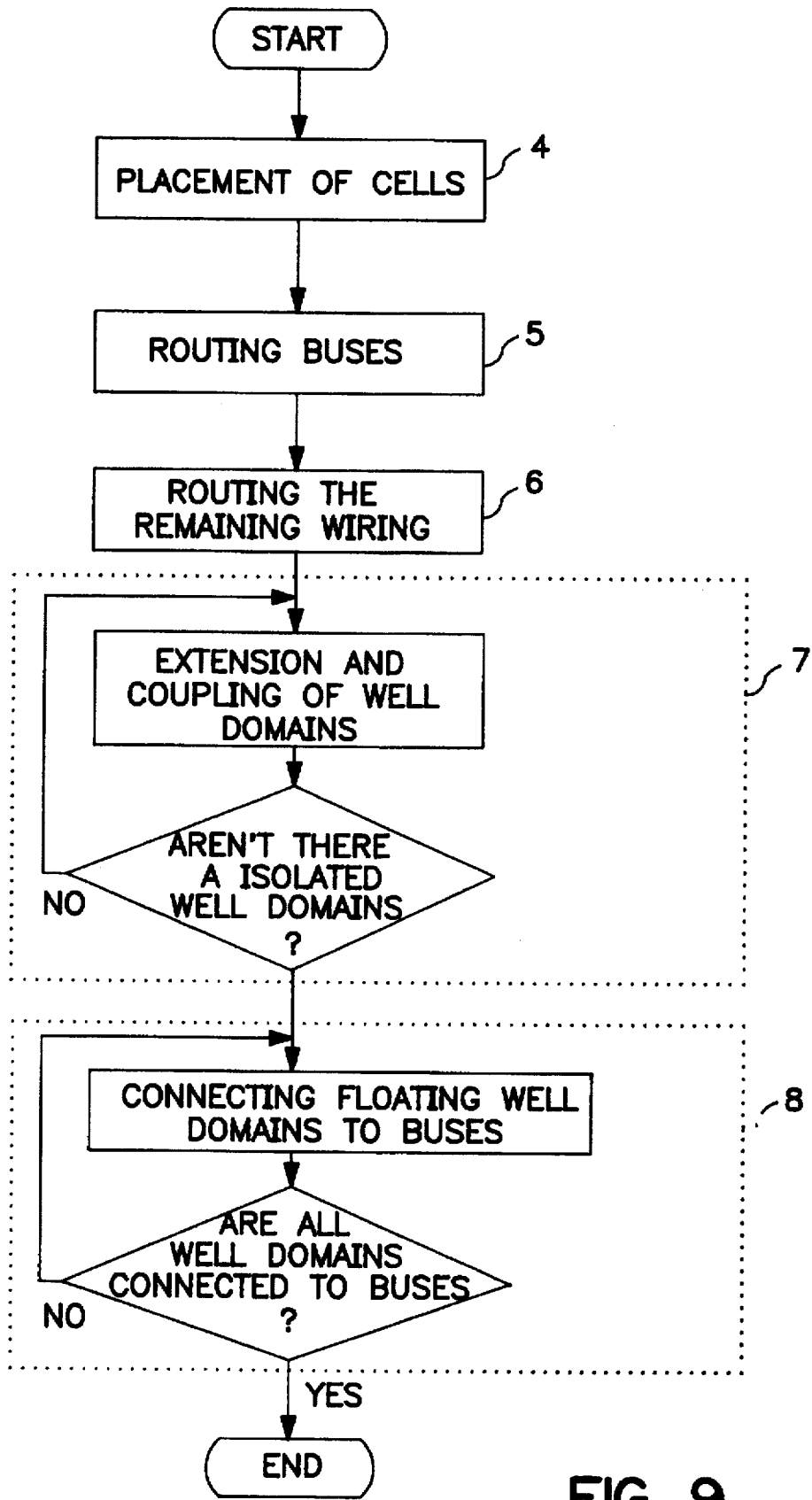
FIG. 9 is a flow chart showing a method for automatically designing LSI layout in the second embodiment of the invention.
Figure 10:
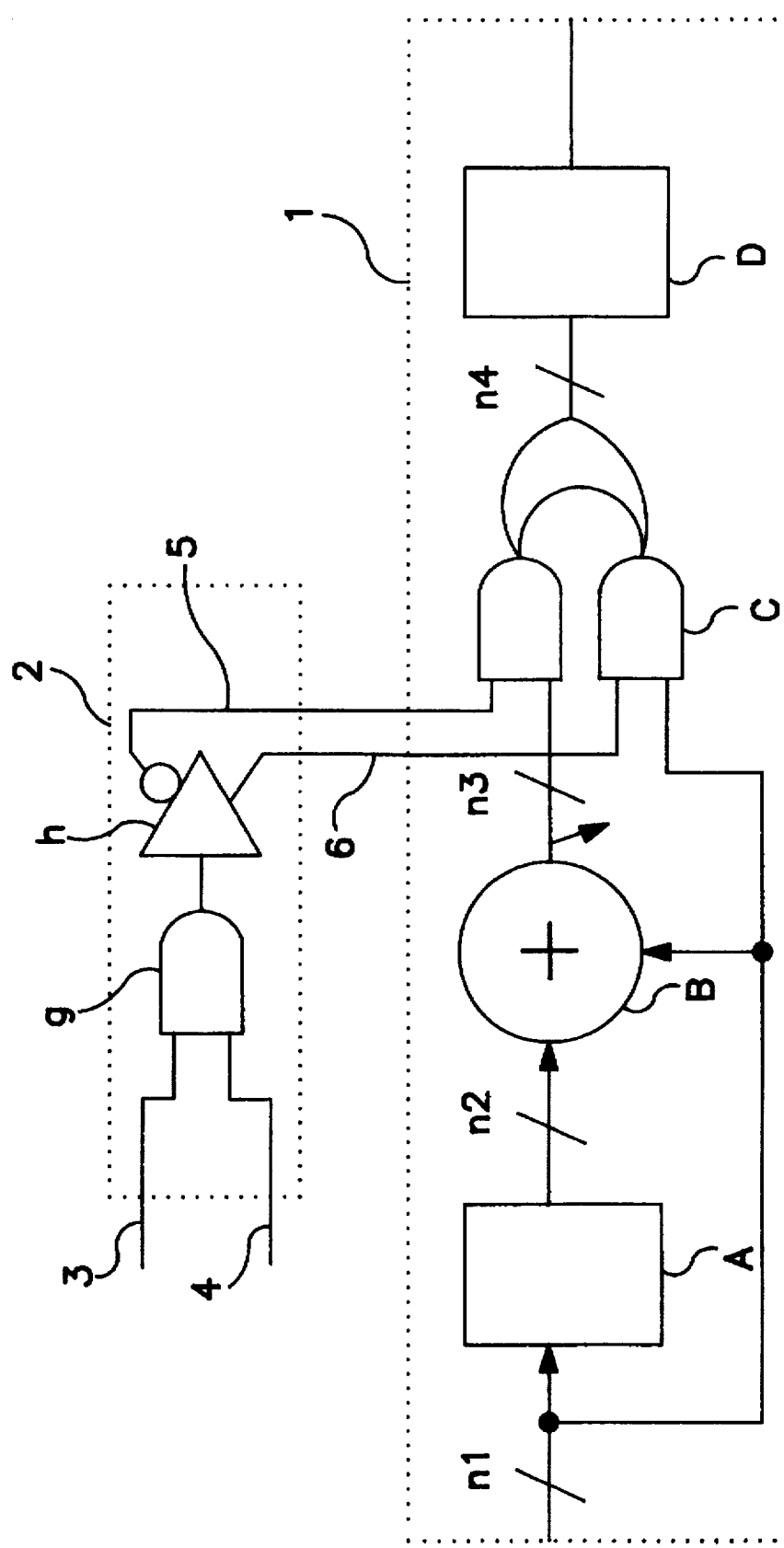
FIG. 10 is a figure showing a block of an electronic circuit.

FIG. 9 is a flow chart showing the method for automatically designing LSI layout in the second embodiment of the invention.

Steps 1 to 3 are the same as described earlier and are therefore omitted. The well regions of each cell maybe isolated after the cell placement step (4), the bus routing step (5) and the detail routing step between the cells (6).

In the next step, the neighboring well regions are extended and merged so there are not isolated well regions in each cell row (7). Then the coupled well regions are connected to the power source potential by the power bus and the power supply lines (8).

Since each well region is extended and merged in the end, the cell placement is possible without considering design rules of separation between well regions. All well regions are connected to the power source potential after placement, therefore the well regions do not need to be connected to the power source potential during the design of a cell. This makes the cell design easier.

What is claimed:

1. A method for designing a layout of a large scale integrated (LSI) circuit having a first group of cells, each cell having a plurality of unit cells placed in a vertical direction or in a horizontal direction, and a second group of cells, each cell consisting of a single cell, comprising the steps of:

dividing said first group of cells into a plurality of sub-groups of cells based on bit-slice information, placing each cell of said sub-groups of cells at adjacent position in a horizontal direction or in a vertical direction in order of number of connections between each cell, whereby said first groups of cells are placed in an array form, and placing each cell of said second group of cells at open spaces of said first group of cells placed in an array form so as to make said layout of LSI substantially rectangular.

2. The method of claim 1, wherein said first placing step further comprises replacing cells having the same number of connections in order to minimize the data line delay.

* * * * *